(12) United States Patent
Yamaoka et al.

(10) Patent No.: US 6,952,104 B2
(45) Date of Patent: Oct. 4, 2005

(54) INSPECTION METHOD AND APPARATUS FOR TESTING FINE PITCH TRACES

(75) Inventors: Shuji Yamaoka, Hiroshima (JP); Shogo Ishioka, Hiroshima (JP)

(73) Assignee: OHT Inc., Hiroshima (JP)

( * ) Notice: Subject to any disclaimer, the term of this patent is extended or adjusted under 35 U.S.C. 154(b) by 48 days.

(21) Appl. No.: 10/461,875

(22) Filed: Jun. 16, 2003

(65) Prior Publication Data

US 2004/0095144 A1 May 20, 2004

(30) Foreign Application Priority Data

May 27, 2001 (JP) ........................................ 2002-152246

(51) Int. Cl.$^7$ ......................... H01H 31/02; G01R 27/26
(52) U.S. Cl. ........................ 324/537; 324/686; 324/690
(58) Field of Search ................................ 324/686, 690, 324/527–531, 519, 512, 515, 559, 661, 658, 158.1, 537, 770, 750–754

(56) References Cited

U.S. PATENT DOCUMENTS

| | | | | |
|---|---|---|---|---|
| 4,229,693 A | * | 10/1980 | Irick et al. | 324/519 |
| 4,565,966 A | * | 1/1986 | Burr et al. | 324/519 |
| 4,656,416 A | * | 4/1987 | Brasfield | 324/527 |
| 5,138,266 A | * | 8/1992 | Stearns | 324/537 |
| 5,256,975 A | * | 10/1993 | Mellitz et al. | 324/519 |
| 6,160,409 A | * | 12/2000 | Nurioka | 324/754 |

* cited by examiner

Primary Examiner—Paresh Patel
(74) Attorney, Agent, or Firm—Westerman, Hattori, Daniels & Adrian, LLP

(57) ABSTRACT

An inspection apparatus and method are disclosed. The inspection apparatus comprises a probe 30 having a width equal to or less than that of the layout pitch of conductive patterns 15 to be inspected, and a sensor section 20 having an area capable of covering the layout region of the conductive patterns. The probe 30 is adapted to be scanningly moved across an inspection-signal supply region including respective portions of the conductive patterns. The sensor section 20 is positioned opposed to the conductive patterns 15. An AC inspection signal is fed from an AC power source 35 to the probe 30 to form a capacitive coupling between one electrode or the conductive pattern, and the other electrode or the sensor section 20, and a detected signal from the sensor section 20 is amplified through an amplifier 25 to check the detected signal. Then, it is determined if each of the conductive patterns supplied with the inspection signal includes a short-circuit, according to whether the level of the detected signal is different from a signal level in a normal state. The present invention can provide an inspection apparatus and method capable of readily detecting a short-circuit possibly existing in various conductive patterns, in a simple control.

8 Claims, 6 Drawing Sheets

(A) output waveform in normal state (B) output waveform in short-circuit state

INSPECTION METHOD AND APPARATUS FOR TESTING FINE PITCH TRACES

FIELD OF THE INVENTION

The present invention relates to an apparatus and method for inspecting the presence of a short-circuit in circuit board patterns.

BACKGROUND ART

In a production process of a circuit board, after conductive patterns are formed on the circuit board, it is necessary to inspect that no defect, such as breakage and short-circuit, is included in the formed conductive patterns.

As one technique for inspecting conductive patterns, there has heretofore been known a contact-type inspection technique for performing a conduction test and others of conductive patterns, in such a manner that an electrical signal is supplied from one of probes or pins which are, respectively, in contact with both ends of each of the conductive patterns, and the electrical signal is picked up from the other pin. In this technique, the electrical signal is supplied by putting the pins or metal probes, respectively, on all of the contact terminals of the conductive patterns, and sending an electric current from the metal probes to the conductive patterns.

Late years, in connection with the high densification of conductive patterns, the wiring pitch in the contact terminal region of the conductive patterns has become more accurate and smaller, and a circuit board with a wiring pitch of less than 50 µm has come onto the market. While a probe card having a number of narrow-pitch probes can be prepared for inspecting such a circuit board, it involves a problem of high production cost.

In addition, if a circuit board to be inspected, or object, is variously changed in wiring patterns, a dedicated probe card has to be prepared for each of objects having different wiring patterns. The resultingly increased production cost has hindered the progress of cost reduction of electronic components.

Furthermore, in actual use, the probe card has to be essentially handled to avoid the risk of breakage possibly caused by brittleness or fragility due to its fine structure.

SUMMARY OF THE INVENTION

In view of the above problems in the conventional techniques, it is therefore an object of the present invention to provide an apparatus and method capable of inspecting fine wiring patterns in a simple structure and adequately coping with the change of wiring patterns.

In order to achieve this object, according to a first aspect of the present invention, there is provided an inspection apparatus comprising: an inspection-signal supply terminal adapted to be disposed on one of the surfaces of a circuit board formed with a plurality of conductive patterns to be inspected, so as to supply an inspection signal to each of the conductive patterns therethrough, wherein the inspection-signal supply terminal has a width equal to or less than that of the layout pitch of the conductive patterns; scanning means for scanningly moving the inspection-signal supply terminal across an inspection-signal supply region including respective portions of the conductive patterns; a sensor section adapted to be disposed on the other surface of the circuit board at least at a position opposed to the inspection-signal supply terminal so as to detect a signal from each of the conductive patterns in response to the inspection signal supplied from the inspection-signal supply terminal to each of the conductive patterns, wherein the sensor section has a width equal to or greater than that three times greater than the layout pitch of the conductive patterns; signal control means for feeding the inspection signal to the inspection-signal supply terminal being scanningly moved by the scanning means, and picking up the detected signal from the sensor section disposed on the other surface of the circuit board; and determination means for determining if each of the conductive patterns supplied with the inspection signal includes a short-circuit, according to whether the level of the detected signal picked up by the signal control means is different from a signal level in a normal state.

In the inspection apparatus as set forth in the first aspect of the present invention, the sensor section may be an electrode with a surface having an area capable of entirely covering the other surface of the circuit board corresponding to the inspection-signal supply region of the conductive patterns. In this case, the electrode is adapted to be fixedly positioned in a capacitive coupling relationship with the conductive patterns serving as corresponding electrodes, so as to detect the signal from each of the conductive patterns.

In the inspection apparatus as set forth in-the first aspect of the present invention, if one of the conductive patterns provides a signal level exceeding a threshold greater than a signal level to be detected by the sensor section when the one conductive pattern is independent of any other conductive patterns, the determination means may be operable to determine that the one conductive pattern is short-circuited to the conductive pattern adjacent thereto.

According to a second aspect of the present invention, there is provided an inspection method for use with an inspection apparatus including an inspection-signal supply terminal having a width equal to or less than that of the layout pitch of conductive patterns formed in a circuit board, and a sensor section having a width equal to or greater than that three times greater than the layout pitch of the conductive patterns. The method comprises: disposing the inspection-signal supply terminal on one of the surfaces of the circuit board and scanningly moving the inspection-signal supply terminal across an inspection-signal supply region including respective portions of the conductive patterns to supply an inspection signal to each of the conductive patterns therethrough, while disposing the sensor section on the other surface of the circuit board at least at a position opposed to the inspection-signal supply terminal to detect a signal from each of the conductive patterns in response to the inspection signal supplied from the inspection-signal supply terminal to each of the conductive patterns; and picking up the detected signal from the sensor section, and determining if each of the conductive patterns supplied with the inspection signal includes a short-circuit, according to whether the level of the detected signal is different from a signal level in a normal state.

In the inspection method as set forth in the second aspect of the present invention, the sensor section may be an electrode with a surface having an area capable of entirely covering the other surface of the circuit board corresponding to the inspection-signal supply region of the conductive patterns. In this case, the electrode is fixedly positioned in a capacitive coupling relationship with the conductive patterns serving as corresponding electrodes, to detect the signal from each of the conductive patterns.

The inspection method as set forth in the second aspect of the present invention may include determining that, if one of the conductive patterns provides a signal level exceeding a threshold greater than a signal level to be detected by the sensor section when the one conductive pattern is independent of any other conductive patterns, the one conductive pattern is short-circuited to the conductive pattern adjacent thereto.

According the present invention, any short-circuit possibly existing in various types of conductive patterns can be detected readily and reliably through a simple control.

Further, present invention can provide an apparatus and method capable of inspecting fine wiring patterns in a simple structure and adequately coping with the change of wiring patterns.

Other features and advantages of the present invention will be apparent from the accompanying drawings and from the detailed description.

DESCRIPTION OF THE PREFERRED EMBODIMENT

With reference to the drawings, an inspection apparatus and method according to preferred embodiments of the present invention will now be described in detail.

The present invention is not limited to after-mentioned specific descriptions, such as relative configurations or numerical values of components or elements, and it is to be understood that the present invention defined in the appended claims is not necessarily limited to such specific descriptions, unless otherwise specified.

The preferred embodiment of the present invention will be described in conjunction with an inspection apparatus for inspecting a short-circuit possibly existing in conductive patterns or wiring patterns of a liquid-crystal display panel.

Figure 1:
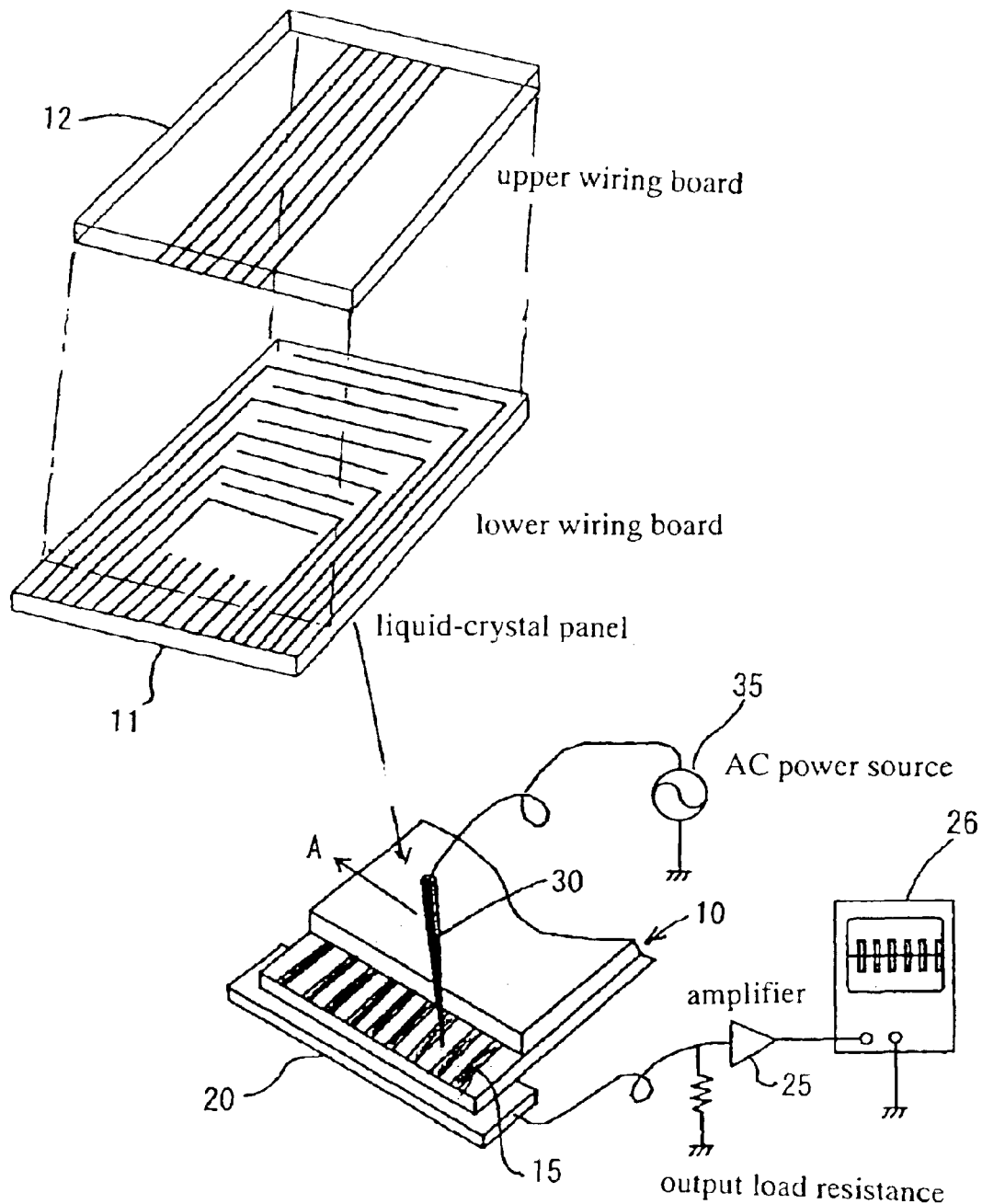
FIG. 1 is an explanatory diagram of the principal of inspection in an inspection apparatus according to one embodiment of the present invention.

Firstly, the principle of inspecting conductive patterns using the inspection apparatus according to the preferred embodiment of the present invention will be described with reference to FIGS. 1 to 3, wherein FIG. 1 is an explanatory diagram of the principal of the inspection, FIG. 2 being an explanatory diagram of inspection results, and FIG. 3 being an explanatory equivalent circuit diagram of the fundamental structure of an inspection apparatus according to the present invention.

In FIG. 1, the reference numeral 10 indicates a circuit board as an inspection object. In this preferred embodiment, the inspection object is a liquid-crystal display panel for use in a portable phone, and it is formed with a plurality of wiring patterns each having approximately the same pattern shape. The reference numerals 11 and 12 indicate lower and upper glass boards, respectively. The respective joint surfaces of the upper and lower glass boards 12, 11 are formed with a plurality of wiring patterns, and bonded together to form the liquid-crystal display panel 10.

The liquid-crystal display panel 10 with the upper and lower glass boards 12, 11 bonded together is shown on the lower side of FIG. 1. While, for the purpose of simplifying the explanation, the liquid-crystal display panel 10 on the lower side of FIG. 1 is illustrated as if it has a small number of the wiring patterns 15, it actually has several dozen or more of the contact terminals of the wiring patterns 15 arranged at a fine pitch.

The reference numeral 20 indicates a sensor section, for example a rectangular electrode plate, having an area capable of covering the back surface of the display panel corresponding to the end region or the contact terminal region of the wiring patterns. For example, if the wiring patterns are not exposed on the back surface of the display panel 10, the sensor section 20 is kept in close contact with the back surface of the inspection object or the display panel 10. Thus, when an electric power is supplied to one of the wiring patterns 15, the wiring pattern 15 supplied with the electric power is capacitively coupled with the sensor section 20 through the glass board. The reference numeral 25 indicates an amplifier for amplifying a detected signal from the sensor section 20, and the reference numeral 26 indicates a display unit for displaying inspection results.

The reference numeral 30 indicates an inspection-signal supply terminal (probe). The front end of the inspection-signal supply terminal 30 is made, for example, of a material having flexibility. The front end of the inspection-signal supply terminal 30 has a diameter substantially smaller than the layout pitch of the wiring patterns, so that it is brought into contact with only either one of the wiring patterns to supply an inspection signal to the wiring pattern through the contact terminal thereof. In this preferred embodiment, the inspection-signal supply terminal 30 is scanningly moved in a direction the arrow A in FIG. 1 to cut across from one end to the other end of the contact terminal region of the wiring patterns, to allow an inspection signal fed from an inspection-signal generator section (AC-signal generator section) 35 to the inspection-signal supply terminal 30 to be supplied sequentially to the respective contact terminals.

In this manner, an AC inspection signal is fed from the AC power source 35 to the inspection-signal supply terminal (probe) 30 to form a capacitive coupling between one electrode, or the conductive pattern 15 being supplied with the inspection signal, and the other electrode, or the sensor section 20, and then a detected signal from the sensor section 20 is amplified through the amplifier 25 to check the detected signal.

Some examples of the detected signal from the sensor section 20 will be described with reference to FIG. 2.

In response to the supply of an inspection signal to one of the wiring patterns (hereinafter referred to as "signaled wiring pattern"), a certain AC current is supplied to the amplifier 25 through a capacitance formed between the signaled wiring pattern having a certain width and a portion of the sensor section 20 which is disposed on the back surface of the circuit board 10 and opposed to the signaled wiring pattern through the circuit board 10. Then, a given AC voltage will be generated from the amplifier 25. This voltage is primarily determined by the area of the signaled wiring pattern opposed to the sensor section 20.

For example, in a specific circuit board, such as a liquid-crystal panel, having a plurality of wiring patterns arranged at the same pitch, the same capacitance will be formed between respective pairs of the signaled wiring patterns 15 and the portions of the sensor section 20 opposed to the corresponding signaled wiring patterns. Thus, if the wiring patterns have neither short-circuit nor other defects, inspection results will be obtained as signals each having approximately the same level as shown in FIG. 2(A).

Figure 2:
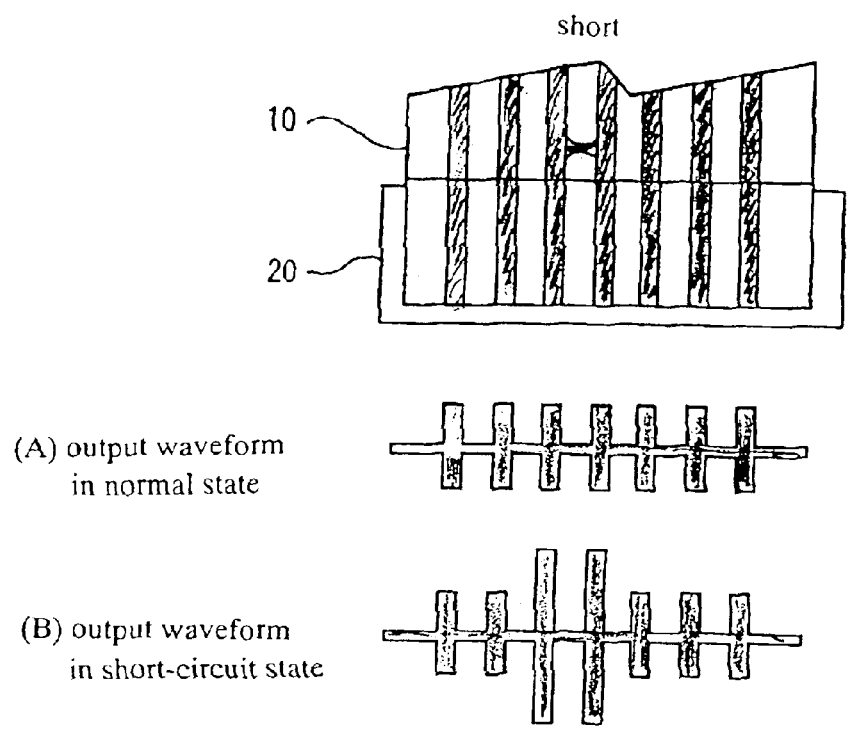
FIG. 2 is an explanatory diagram of inspection results in the inspection apparatus according to the embodiment of the present invention.

On the other hand, if some of the wiring patterns include a short-circuit as shown in FIG. 2, an AC inspection signal will be supplied to not only one wiring pattern in contact with the inspection-signal supply terminal (probe) 30 but also another wiring pattern to which the signaled wiring pattern is short-circuited.

Figure 3:
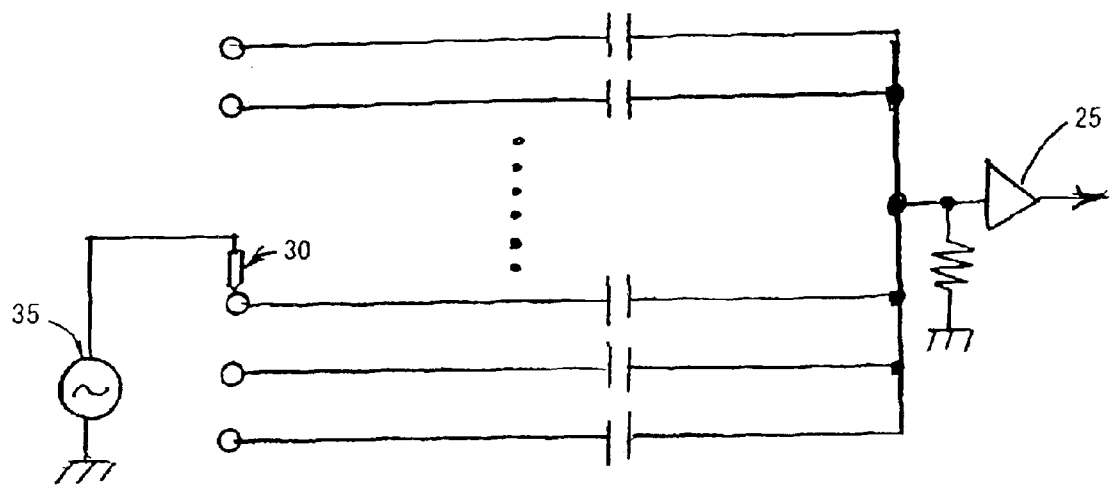
FIG. 3 is an equivalent circuit diagram of the inspection apparatus according to the embodiment of the present invention.

This short-circuit state will be described in more detail with reference to FIG. 3 showing the schematic equivalent circuit of the inspection apparatus according to the preferred embodiment. As shown in FIG. 3, ones of the ends of capacitors composed of the portions of the sensors 20 are entirely connected with each other. When the probe 30 is moved and brought into contact with one of the other ends of the capacitors, only one signaled wiring pattern in contact with the probe will be electrically connected to the amplifier 25 if the signaled wiring pattern is in a normal state or includes no short-circuit.

If the signaled wiring pattern in contact with the probe is short-circuited to another wiring pattern adjacent thereto, the two wiring patterns with an area approximately two times grater than that in a normal state will be opposed to the sensor section 20. Thus, the output of the amplifier 25 will be largely increased as compared to that when the signaled wiring pattern includes no short-circuit. Inspection results in the short circuit state are shown in FIG. 2(B).

As shown in FIG. 2(B), the position of short-circuited wiring patters can be determined by monitoring the output of the amplifier 25 and specifying a position where the detected signal or the output of the amplifier 25 is largely increased as compared to that in a normal state. Thus, a defective product can be reliably identified in a simple structure without any particular operation, such as an operation of positioning the probe at a high degree of accuracy.

If the wiring patterns have approximately the same pattern shape as in the above embodiment, the amplifier 25 will provide approximately the same output level with respect to each of wiring patterns if they are in a normal state. In this case, a given threshold may be set to determine that a short-circuit exists at a position where the amplifier 25 provides an output level equal to or greater than the threshold.

Even in a case where relatively adjacent wiring patterns are uniformly arranged in their contact terminal region, but the wiring patterns are significantly different in pattern shape, the inspection method according to the above embodiment allows the presence of short-circuit in such wiring patterns to be readily determined in a simple process.

Specifically, in such a case, the relationship between inspection signals and inspection results is determined in advance by scanningly moving a probe along the surface of a circuit board formed with normal wiring patterns, and is stored as a reference inspection result. Then, an actual inspection result is comparted with the stored reference inspection result. For example, if the difference between the actual inspection result and the reference inspection result falls within a given range, it may be determined as a non-defective circuit board. If the difference cuts across the given range, it may be determined as a defective circuit board.

In this case, a short-circuit can also be reliably inspected by scanningly moving an inspection-signal supply probe simply across wiring patterns without the need for locating the probe at a specific position with respect to each of the wiring patterns.

The structure of the inspection apparatus for performing the above inspection will be specifically described with reference to FIG. 4.

Figure 4:
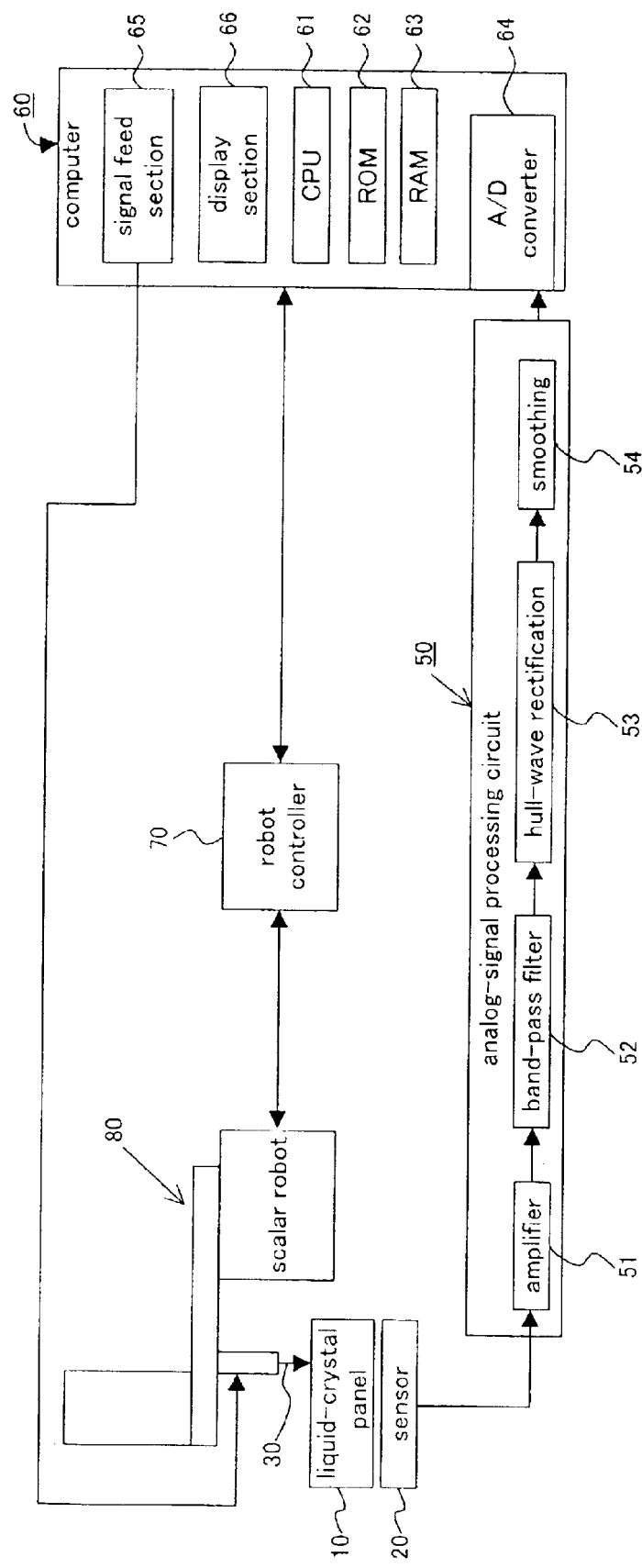
FIG. 4 is an explanatory block diagram of the specific structure of the inspection apparatus according to the embodiment of the present invention.

In FIG. 4, the same or equivalent components as those of the inspection apparatus in FIG. 1 are defined by the same reference numerals. A liquid-crystal panel 10 as an inspection object is located at an inspection position, and a sensor section 20 is located and fixed on the back surface of the liquid-crystal panel 10 at a position corresponding to a contact terminal region, or an inspection-signal supply region, of wiring patterns formed in the liquid-crystal display panel 10.

In the inspection apparatus according to this preferred embodiment, at least the surface of the sensor section 20 is formed as a metal electrode, such as aluminum electrode (AL), to provide a higher capacitance between the sensor section 20 and the conductive pattern, than that in a sensor section using a semiconductor electrode A signal detected from the sensor section 20 is sent to an analog-signal processing circuit 50. An analog signal subjected to an analog-signal processing through analog-signal processing circuit is sent to a control section 60 to determine if a short-circuit is included in one wiring pattern of the liquid-crystal display panel in contact with an inspection-signal supply terminal 30. The control section 60 is also operable to controllably feed an inspection signal to the inspection-signal supply terminal 30.

The inspection-signal supply terminal 30 is adapted to be scanningly moved across the feeder terminal region or the like of the wiring patterns of the liquid-crystal display panel 10 to supply an inspection signal sequentially to the wiring patterns. The front end of the inspection-signal supply terminal 30 is made, for example, of a flexible tungsten alloy, and has a width equal to or less than the pattern pitch or layout pitch of the wiring patterns (pattern or layout pitch: the total length of the width of one wiring pattern and the distance between adjacent wiring patterns). For example, the inspection-signal supply terminal 30 can be formed to have a front end (contact end) with a diameter of 15 $\mu$m and the remaining portion with a diameter of 150 $\mu$m, to inspect wiring patterns of a circuit board in which the width of each of the wiring patterns is 30 $\mu$m, and the distance between the adjacent wiring patterns is about 20 $\mu$m.

A robot controller 70 is operable to control a scalar robot 80 according to an instruction of the control section 60. The scalar robot 80 is adapted to locate and hold the liquid-crystal panel 10 at a given inspection position where the front end of the inspection-signal supply terminal 30 can contact any of the contact terminals of the wiring patterns in the liquid-crystal panel 10, and to scanningly move the inspection-signal supply terminal 30 so as to allow the front end of the inspection-signal supply terminal 30 to cut across all of the contact terminals sequentially.

The analog-signal processing circuit 50 includes an amplifier 51 for amplifying a detected signal from the sensor section 20, a band-pass filter 52 for eliminating noise components in the amplified detected signal from the amplifier 51, a rectification circuit 53 for full-wave-rectifying the filtered detected signal from the band-pass filter 52, and a smoothing circuit 54 for smoothing the full-wave-rectified detected signal from the rectification circuit 53.

The control section 60 is operable to systematically control the inspection apparatus according to this embodiment in its entirety. The control section 60 includes a computer (CPU) 61, a ROM 62 storing a control procedure for the CPC 61, a RAM 63 for temporarily storing various information such as status information about processing of the CPU 61, an A/D converter 64 for converting an analog signal from the analog-signal processing circuit 50 into an corresponding digital signal, a signal feed section 65 for feeding an inspection signal to the inspection-signal supply terminal 30, and a display section 66 for displaying inspection results or an operational instruction guidance.

The signal feed section 65 is operable to generate an inspection signal, for example a sine-wave signal with a signal level of 10 Vp-p and a frequency of 100 KHz, and feed the generated inspection signal to the inspection-signal supply terminal 30. For the inspection signal of 100 KHz, the band-pass filter 52 is configured to allow the band of 100 KHz to be passed therethrough.

Figure 5:
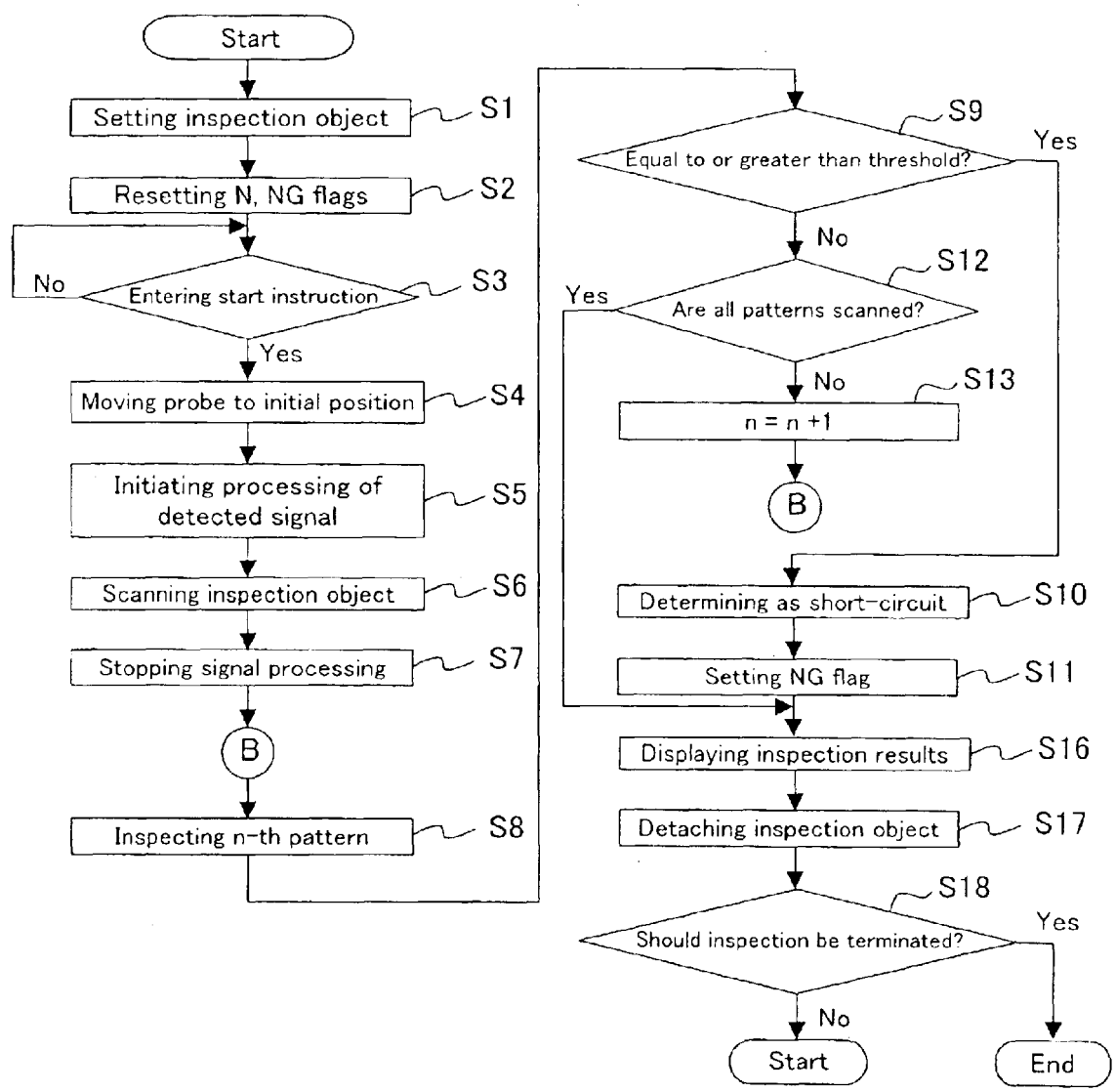
FIG. 5 is an explanatory flowchart of an inspection method for use with the inspection apparatus according to the embodiment of the present invention.

With reference to a flowchart in FIG. 5, an inspection process using the above inspection apparatus will be described below.

In Step S1, the liquid-crystal panel 10 as an inspection object is set at the inspection position of the inspection apparatus. Then, in Step S2, a NG flag representing the presence of a defective portion in wiring patterns to be inspected is reset, and a number flag n representing each of the wiring patterns is set in "1" to allow the 1st wiring pattern to be inspected to determine if it includes a short-circuit. Through the above process, the entire preparation for inspection has been completed, and the control section 60 waits until a start instruction representing the initiation of inspection is entered in Step S3.

In response to the start instruction in Step S3, the process advances to Step S4, and the control section 60 instructs the robot controller 70 to control the scalar robot 80 in such manner that it moves the inspection-signal supply terminal (probe) 30 to an inspection initiation position in the contact terminal of one of the endmost wiring patterns (in one of the ends of a contact terminal region or inspection-signal supply region of the wiring patterns).

In Step S5, the signal feed section 65 is activated to feed an inspection signal to the inspection-signal supply terminal (probe) 30 and maintain such that the inspection-signal supply terminal 30 can transmit or supply the inspection signal from the signal feed section 65 to any one of the wiring patterns when the front end of the inspection-signal supply terminal 30 is brought into contact with the wiring pattern. Simultaneously, the analog-signal processing circuit 50 is activated to pick up a detected signal from the sensor section 20. Subsequently, the analog-signal processing circuit 50 picks up detected signals at given time intervals until the inspection-signal supply terminal 30 is moved to the other endmost wiring pattern, and resulting inspection data are sequentially stored, for example, in the RAM 63.

After the inspection-signal supply terminal (probe) 30 has been scanningly moved across all of the wiring patterns of the circuit board, the process advances to Step S7, and the signal feed section 65 is deactivated. Then, an operation of determining if a short-circuit is included in the wiring patterns (hereinafter referred to as "determination operation") is initiated in Steps S8 to S16.

Specifically, in Step S8, the stored voltage value corresponding to the detected signal of the sensor section 20 when the inspection signal is supplied to the n-th wiring patter is read out. In an initial determination operation, the stored voltage value corresponding to the detected signal of the sensor section 20 when the inspection signal is supplied to the 1st wiring patter located at the inspection initiation position is read out.

Then, in Step S9, it is determined if the read detected voltage (output voltage) of the sensor section 20 is equal to or greater than a threshold defined on the basis of a signal level detected in a normal state. If the read detected voltage is less than the threshold, it is determined that the wiring pattern is normal, and the process advances to Step S12.

If the read detected voltage of the sensor section 20 is equal to or greater than the threshold, the process advances to Step S10, and it is determined that the above n-th wiring pattern is short-circuited, for example, to another wiring pattern adjacent thereto. Then, a NG flag is set in Step S11, and the process advances to Step S16.

In Step 12, the n flag is checked to determine if the n flag represents the last wiring pattern to be inspected. If the determination operation for all of the wiring patterns of the liquid-crystal panel 10 is not completed, the process advances to Step 13, and the n flag is incremented by one, or set in [n=n+1], and the process returns to Step 8 so as to allow the next wiring pattern to be subjected to the determination processing.

If the determination operation for all of the wiring patterns is completed in Step 12, the process advances to Step S16.

In Step S16, inspection results are displayed. For example, it is checked whether a NG flag is set. If a NG flag is set, the display section 66 displays a NG sign indicating that the liquid-crystal panel 10 is a defective product including a short-circuit. If a NG flag is not set, the display section 66 displays an OK sign indicating that the liquid-crystal panel 10 is a normal product.

In Step S17, the liquid-crystal panel is detached from the inspection apparatus. Then, in Step S18, it is checked whether the inspection of the liquid-crystal panel is completed. If there is another liquid-crystal panel to be inspected, the process returns to Step S1, and another liquid-crystal panel is set in the inspection apparatus.

If there is no additional inspection object at Step S18, the process will be terminated.

While the liquid-crystal panel in the above inspection process has been set in and detached from the inspection apparatus, respectively, in Steps S1 and S17, the present invention is not limited thereto. For example, the liquid-crystal panel may be automatically set in and detached from the inspection apparatus, and the detached liquid-crystal panel may be automatically transferred to either one of a normal-product storage area and a defective-product storage area, according to the result of the determination operation.

Further, the above inspection process may be incorporated as a part of a production process, in such a manner that liquid-crystal panels transferred from the upstream process are sequentially inspected, and only the liquid-crystal panels determined as a normal product are transferred to the downstream process.

Figure 6:
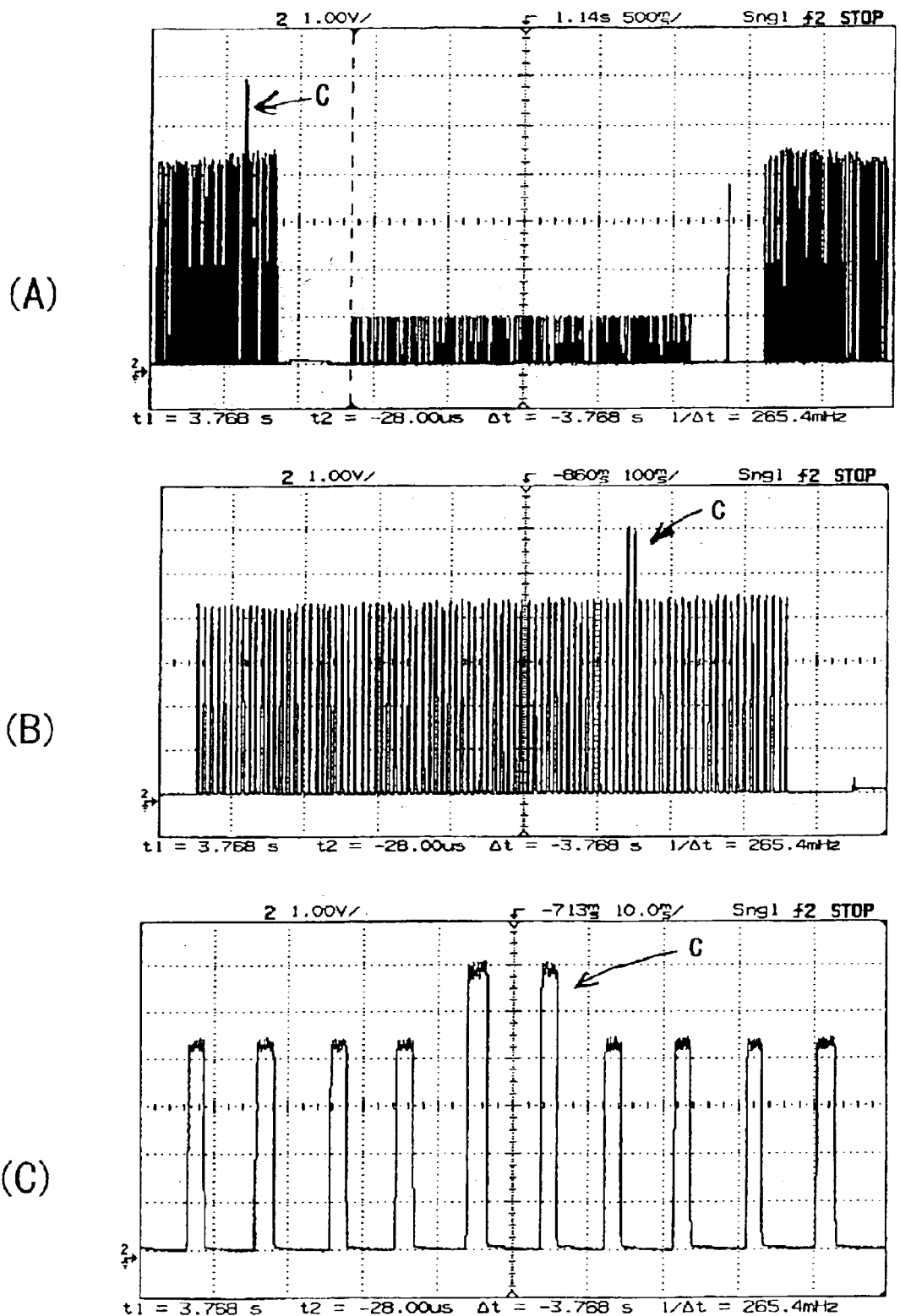
FIG. 6 is a graph showing an inspection result in the inspection apparatus according to the embodiment of the present invention, wherein the contact terminal region of wiring patterns includes a short-circuit on the left side thereof.
Figure 7:
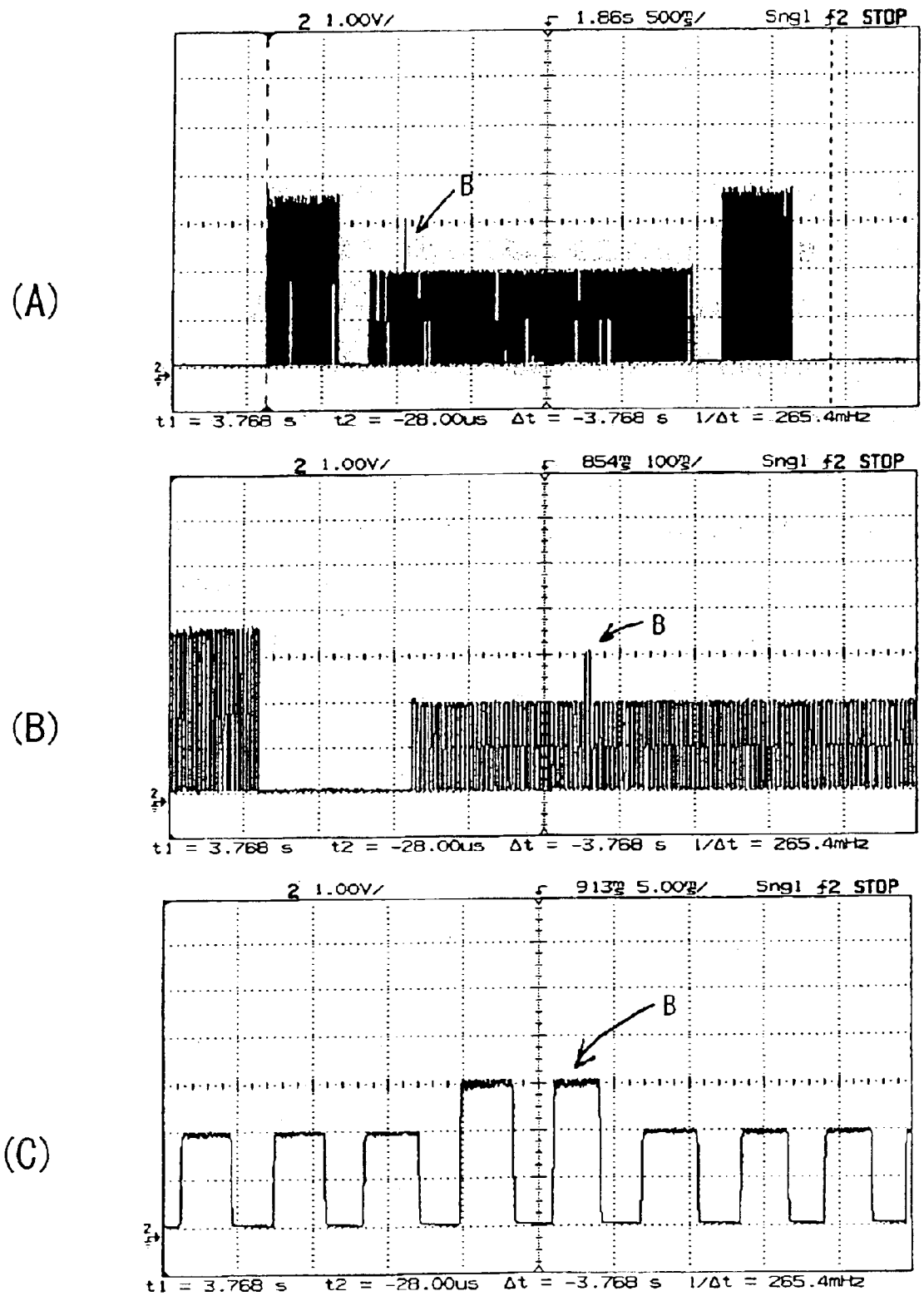
FIG. 7 is a graph showing an inspection result in the inspection apparatus according to the embodiment of the present invention, wherein the contact terminal region of wiring patterns includes a short-circuit in the center thereof.

FIGS. 6 and 7 show examples of inspection results obtained from a defective liquid-crystal panel according to the above inspection process. FIG. 6 shows one example of inspection results in a case where the contact terminal region of wiring patterns of the liquid-crystal panel includes a short-circuit on the left side thereof. FIG. 7 shows one example of inspection results in a case where the contact terminal region includes a short-circuit in the center thereof.

The contact terminals of the liquid-crystal panel in FIGS. 6 and 7 are arranged at a relatively wide pattern pitch on the right and left sides of the contact terminal region, and at a relatively narrow pattern pitch in the center of the contact terminal region.

In the inspection apparatus according to the preferred embodiment, even if wiring patterns to be inspected are arranged at different layout pitches as in the above examples, any short-circuit possibly existing in the wiring patterns can be reliably detected only by scanningly moving the inspection-signal supply probe across the entire wiring patterns without any particular operation or control. In addition, the detected signal level used as a criterion of the determination operation has a significant difference in between normal and abnormal states. Thus, the determination operation can provide a highly reliable result.

FIG. 6(A) or 7(A) shows the entire inspection results. FIG. 6(B) or 7(B) is an enlarged diagram showing a detected waveform in a portion of the contact terminal region including an abnormality or short-circuit. FIG. 6(C) or 7(C) is an enlarged diagram showing a detected waveform with the short-circuited portion located at the center thereof.

For example, one division of the horizontal axis is 500 ms in FIG. 6(A) or 7(A), 100 ms in FIG. 6(B) or 7(B), and 10 ms in FIG. 6(C) or 7(C). Since there is a great difference between the respective detected waveforms in the short-circuited and normal portions, the short-circuit can be reliably detected, for example, by identifying a short-circuit according to a threshold derived by adding a half value of the difference between respective detected-signal levels in normal and short-circuit states to an average detected-signal level at the normal state.

In the above description, the presence of short-circuit is determined after the inspection results are picked up from all of the wiring patterns in one circuit board as an inspection object. This is down because a processing time is not so extended even if the determination operation is initiated after the completion of the pickup of the entire inspection results. Thus, it is understood that the inspection apparatus may be configure to perform the determination operation every time the individual inspection result is obtained. In this case, if a short-circuit is detected in the course of the inspection process, the inspected circuit board may be immediately handled as a defective product. Thus, the subsequent inspection process can be discontinued so as to re-initiate a new inspection operation for another circuit board to provide more reduced inspection time.

As mentioned above, according to the inspection apparatus and method according to the preferred embodiment, any short-circuit possibly existing in wiring patterns can be detected only by scanningly moving the inspection-signal supply terminal across the wiring patterns without the need for positioning a plurality of inspection pins to the corresponding contact terminals of wiring patterns in a contact manner. Thus, the inspection apparatus can achieve a highly accurate and reliable inspection operation in a simplified structure.

In addition, desirable inspection results can be obtained only by scanningly moving the inspection-signal supply terminal across an inspection-signal supply region, e.g. contact terminal region, of the wiring patterns. Thus, even if the layout pitch of wiring patterns is changed, the inspection operation can be performed only by controlling the route of the inspection-signal supply terminal, instead of positioning the inspection pins in a high degree of accuracy. Further, even if wiring patterns have complicated pattern shapes, or the distance between adjacent wiring patterns varies to a large degree, the inspection operation can be adequately performed without any complicated positioning operation.

For example, even in an operation of inspecting a circuit board with wiring patterns having contact terminals arranged in a horseshoe shape, all of the wiring patterns can be readily inspected by moving the inspection-signal supply terminal simply along the horseshoe shape of the contact terminal.

While the present invention has been described with reference to specific embodiments, the present invention is not limited to such specific structures or processes in the embodiments. It is obvious to those skilled in the art that various changes and modifications may be made therein without departing from the spirit and scope of the present invention. For example, while the sensor section 20 in the above embodiment is formed as, for example a rectangular electrode plate, having an area capable of covering the contact terminal region of the wiring patterns, and is fixedly positioned, the present invention is not limited such an configuration and arrangement. For example, the sensor section may be formed as an electrode plate having a width equal to several pitches of the wiring patterns to be inspected, and configured to be scanningly moved in synchronous with the movement of the inspection-signal supply terminal. In this case, the sensor section is preferably arranged to have an area capable of covering al least both one wiring pattern and two adjacent wiring patterns.

What is claimed is:

1. An inspection apparatus comprising:
   an inspection-signal supply terminal adapted to be disposed on one of the surfaces of a circuit board formed with a plurality of conductive patterns to be inspected, said conductive patterns being arranged such that the contact terminals of said conductive patterns are disposed parallel to each other, and arranged at a fine pitch with the distance between each of said conductive patterns being equal, so as to supply an inspection signal to each of said conductive patterns therethrough, said inspection-signal supply terminal having a width equal to or less than that of the layout pitch of said conductive patterns;
   scanning means for scanningly moving said inspection-signal supply terminal across and inspection-signal supply region including respective portions of said conductive patterns; from each of said conductive patterns in response to said inspection signal supplied from said
   a sensor section adapted to be disposed on the other surface of said circuit board of at least at a position opposed to said inspection-signal supply terminal so as to detect a signal from each of said conductive patterns in response to said inspection signal supplied from said inspection- signal terminal to each of said conductive patterns, said sensor section having a width equal to or greater than that three times greaterr than the layout pitch of said conductive patterns;
   signal control means for feeding the inspection signal to said inspection-signal supply terminal being scanningly moved by said scanning means, and picking up the detected signal from said sensor section disposed on the other surface of said circuit board; and determination means for determining if each of said conductive patterns supplied with the inspection signal includes a short-circuit, according to whether the level of said detected signal picked up by said signal control means is different from a signal level in a normal state.

2. The inspection apparatus as defined in claim 1, wherein said sensor section is an electrode with a surface having an area capable of entirely covering the other surface of said circuit board corresponding to said inspection-signal supply region of said conductive patterns, wherein said electrode is adapted to be fixedly positioned in a capacitive coupling relationship with said conductive patterns serving as corresponding electrodes, so as to detect the signal from each of said conductive patterns.

3. The inspection apparatus as defined in claim 1, wherein if one of said conductive patterns provides a signal level exceeding a threshold greater than a signal level to be detected by said sensor section when said one conductive pattern is independent of any other conductive patterns, said determination means is operable to determine that said one conductive pattern is short-circuited to the conductive pattern adjacent thereto.

4. The inspection apparatus as defined in claim 2, wherein if one of said conductive patterns provides a signal level exceeding a threshold greater than a signal level to be detected by said sensor section when said one conductive pattern is independent of any other conductive patterns, said determination means is operable to determine that said one conductive pattern is short-circuited to the conductive pattern adjacent thereto.

5. An inspection method for use with an inspection apparatus including an inspection-signal supply terminal having a width equal to or less than that of the layout pitch of conductive patterns formed in a circuit board, said conductive patterns being arranged such that the contact terminals of said conductive patterns are disposed parallel to each other, and arranged at a fine pitch with the distance between each of said conductive patterns being equal and a sensor having a width equal to or greater than that three times greater than the layout pitch of said conductive patterns, said method comprising:

disposing said inspection-signal supply terminal on one of the surfaces of said circuit board and scanningly moving said inspection-signal supply terminal across an inspection-signal supply region including respective portions of said conductive patterns to supply an inspection signal to each of said conductive patterns therethrough, while disposing said sensor section on the other surface of said circuit board at least at a position opposed to said inspection-signal supply terminal to detect a signal from each of said conductive patterns in response to said inspection signal supplied from said inspection-signal supply terminal to each of said conductive patterns; and picking up the detected signal from said sensor section, and determining if each of said conductive patterns supplied with the inspection signal includes a short-circuit, according to whether the level of said detected signal is different from a signal level in a normal state.

6. The inspection method as defined in claim 5, wherein said sensor section is an electrode with a surface having an area capable of entirely covering the other surface of said circuit board corresponding to said inspection-signal supply region of said conductive patterns, wherein said electrode is fixedly positioned in a capacitive coupling relationship with said conductive patterns serving as corresponding electrodes, to detect the signal from each of said conductive patterns.

7. The inspection method as defined in claim 6, which includes determining that, if one of said conductive patterns provides a signal level exceeding a threshold greater than a signal level to be detected by said sensor section when said one conductive pattern is independent of any other conductive patterns, said one conductive pattern is short-circuited to the conductive pattern adjacent thereto.

8. The inspection method as defined in claim 5, which includes determining that, if one of said conductive patterns provides a signal level exceeding a threshold greater than a signal level to be detected by said sensor section when said one conductive pattern is independent of any other conductive patterns, said one conductive pattern is short-circuited to the conductive pattern adjacent thereto.

* * * * *